(12) United States Patent
Hoelen et al.

(10) Patent No.: US 7,731,388 B2
(45) Date of Patent: Jun. 8, 2010

(54) HIGH EFFICIENCY LED LIGHT SOURCE ARRANGEMENT

(75) Inventors: Christoph Gerard August Hoelen, Eindhoven (NL); Johannes Petrus Maria Ansems, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 548 days.

(21) Appl. No.: 11/577,056

(22) PCT Filed: Oct. 10, 2005

(86) PCT No.: PCT/IB2005/053319

§ 371 (c)(1),
(2), (4) Date: Apr. 11, 2007

(87) PCT Pub. No.: WO2006/043195

PCT Pub. Date: Apr. 27, 2006

(65) Prior Publication Data

US 2009/0201677 A1    Aug. 13, 2009

(30) Foreign Application Priority Data

Oct. 18, 2004    (EP) .................................. 04105105

(51) Int. Cl.
*F21V 5/00*    (2006.01)

(52) U.S. Cl. ................... 362/231; 362/245; 362/311.12
(58) Field of Classification Search ................. 362/231, 362/235, 230, 240, 241, 245, 247, 311.03, 362/311.04, 311.05, 311.12
See application file for complete search history.

(56) References Cited

U.S. PATENT DOCUMENTS

| 1,726,379 | A | 8/1929 | Benford |
| 3,754,132 | A | 8/1973 | Mamrud et al. |
| 5,699,201 | A | 12/1997 | Lee |
| 5,775,792 | A * | 7/1998 | Wiese .......................... 362/328 |
| 6,367,956 | B1 | 4/2002 | Becker et al. |
| 6,623,150 | B2 | 9/2003 | Roller et al. |
| 2002/0080622 | A1* | 6/2002 | Pashley et al. .............. 362/555 |
| 2003/0076034 | A1 | 4/2003 | Marshall et al. |

FOREIGN PATENT DOCUMENTS

WO    2004007241 A2    1/2004

* cited by examiner

*Primary Examiner*—John A Ward

(57) ABSTRACT

A light source (100) comprises a number of optical components aligned concentrically along an optical axis (115). The optical components include an array of light emitting diodes (101), a dielectric collimator (109) having surfaces configured to provide total internal reflection of light emitted from the array of diodes, and a second stage reflector (113) to further collimate the beam and which also may be based on total internal reflection by a prism structure on the outside.

29 Claims, 4 Drawing Sheets

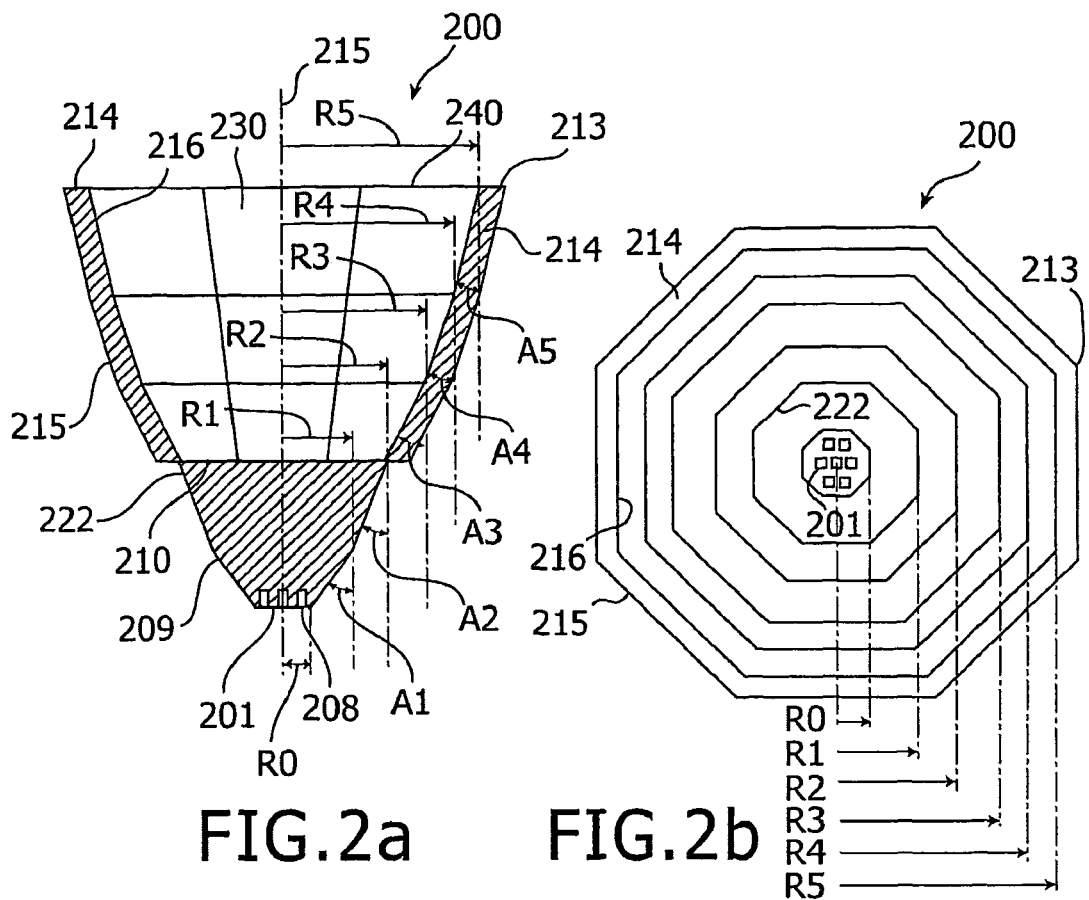
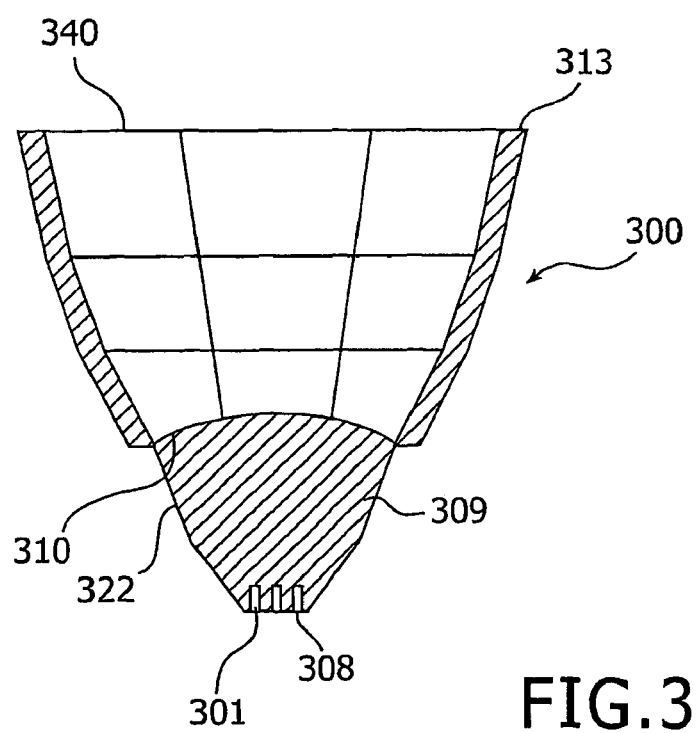

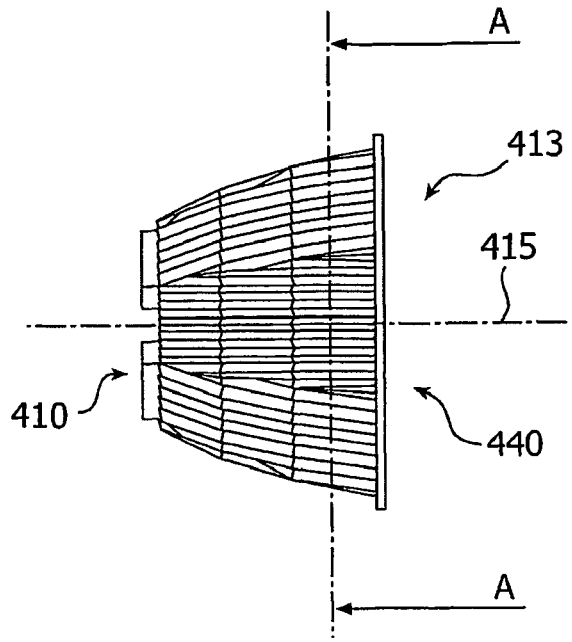
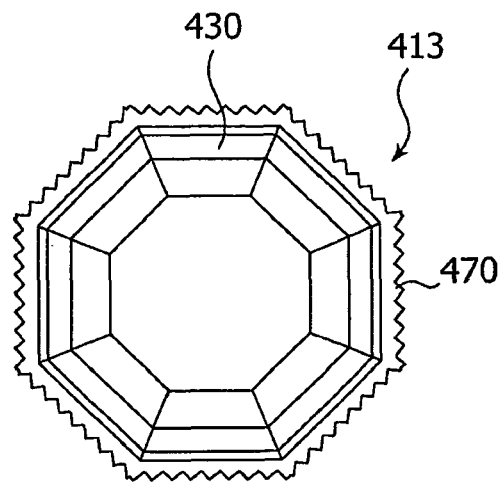
FIG.4a  FIG.4b
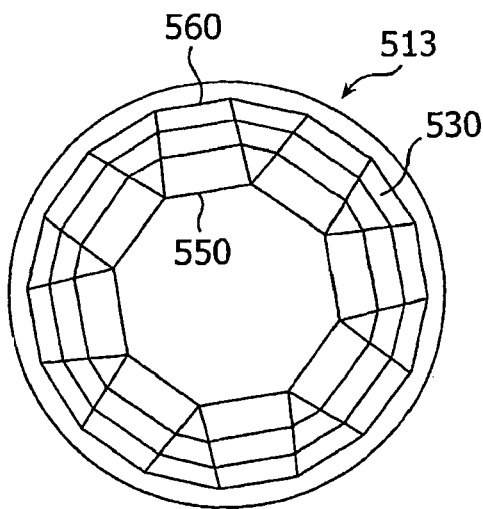
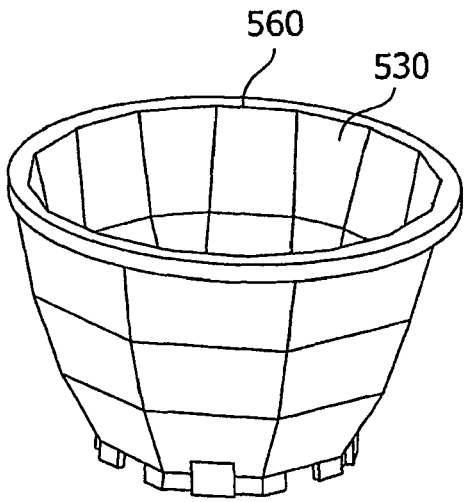
FIG.5a  FIG.5b

HIGH EFFICIENCY LED LIGHT SOURCE ARRANGEMENT

TECHNICAL FIELD

The present invention relates to a light source comprising light emitting diodes and reflecting optical components.

BACKGROUND

Light emitting diodes (LED) are used in many ways to create light having almost any color. One way of obtaining a beam of mixed color light is to direct a plurality of individual beams of light, each beam consisting of light emitted from LEDs of a single wavelength, onto a target, whereby the mixed light is obtained at the target. Another way of obtaining mixed light, using LEDs, is to co-locate LEDs having different wavelength characteristics and mixing the light from the LEDs by way of a diffuser.

Yet another way of obtaining mixed light, using LEDs, is to provide a collimating reflector in contact via a transparent dielectric with the LEDs, as disclosed in US patent Application Publication 2002/0080622 A1. There, a light source including a LED array being embedded in a dielectric filler produces white light via a tubular reflector having a polygon cross sectional shape.

However, the arrangement in US 2002/0080622 A1 does not have a high efficiency in terms of the ratio of input power to the LEDs and the white light power output from the arrangement.

SUMMARY OF THE INVENTION

An object of the present invention is to improve the efficiency of a LED light source capable of producing a light beam of any color.

The object is achieved by way of a lighting system according to claim 1.

A lighting system according to the present invention comprises a number of optical components aligned concentrically along an optical axis. The components include a plurality of light sources, which in preferred embodiments are in the form of LED sources, that emit light of at least a respective first and second color, a dielectric collimator having an entry aperture and an exit aperture. The entry aperture is in optical contact with the light sources and the collimator has facetted surfaces configured to provide total internal reflection of light emitted from the light sources to provide color homogenized and collimated light to exit from the exit aperture. The system also comprises a second optical element having an entry aperture and an exit aperture. The second optical element is configured to further color homogenize and collimate the light exiting from the collimator.

In preferred embodiments, the exit aperture of the collimator may comprise a flat surface oriented perpendicular to the optical axis as well as a convex surface.

Further, the cross sectional area, perpendicular to the optical axis, at the exit aperture of the collimator is preferably larger than the cross sectional area at the entry aperture of the collimator.

The collimator comprises a cross sectional shape perpendicular to the optical axis that preferably is polygonal and in preferred embodiments the number of segments of the polygonal cross sectional shape of the collimator in a plane perpendicular to the optical axis at the exit aperture of the collimator is larger than at the entry aperture of the collimator. Also, in preferred embodiments, the collimator comprises any one shape of a hexagonal, heptagonal, octagonal and enneagonal shape perpendicular to the optical axis at the exit aperture of the collimator.

Also the second optical element may, in preferred embodiments of the invention, be in the form of a reflector with facetted surfaces.

The cross sectional area, perpendicular to the optical axis, at the exit aperture of the second optical element is preferably larger than the cross sectional area at the entry aperture of the second optical element, the entry aperture being defined as the total surface area that light is entered through into the optical element and the exit aperture being defined as the total area of the optical element that the light is emitted from.

In further embodiments, also the second optical element comprises a polygonal cross sectional shape perpendicular to the optical axis and the number of segments of the polygonal cross sectional shape of the second optical element in a plane perpendicular to the optical axis at the exit aperture of the second optical element is larger than at the entry aperture of the second optical element.

In yet further embodiments, the number of segments of the polygonal cross sectional shape of the second optical element in a plane perpendicular to the optical axis at the entry aperture of the second optical element corresponds to any one shape of a hexagonal, heptagonal, octagonal and enneagonal shape and at the exit aperture of the second optical element the number of segments of the polygonal cross sectional shape is 12, 14, 16 or 18 respectively. These segment configurations would advantageously perform best with respect to homogenization while still being able to provide more or less circularly shaped beams.

Further preferred embodiments include those where either the collimator alone, the second optical element alone or both the collimator and the second optical element are made of a transparent dielectric having an outside surface that comprises a plurality of elongated prism structures to provide the total internal reflection of the light emitted from the light sources.

In such embodiments, the elongated prism structures preferably extend in a direction from the entry aperture to the exit aperture of the collimator and/or the second optical element.

At least one facet of the collimator and/or the second optical element comprises elongated prism structures that are oriented parallel to each other. In other preferred embodiments, at least one facet of the collimator and/or the second optical element comprises elongated prism structures that are oriented such that a distance between any two structures at the exit aperture is larger than the distance between said any two structures at the entry aperture.

The index of refraction of any of the dielectric collimator and the second optical element is preferably larger than 1.3 and the material may be e.g. glass, ceramic, a polymer like Polymethyl Methacrylate or polycarbonate, a silicon resin, or combinations thereof.

In a preferred embodiment the collimator is provided with a cavity to accommodate the light sources and filled with an transparent or translucent medium between the dielectric material and the light sources.

Preferably, the number of segments of the polygonal cross sectional shape of the collimator at the entrance aperture of the collimator is between 4 and 9 and the number of segments of the polygonal cross sectional shape of the collimator at the exit aperture of the collimator and of the polygonal cross sectional shape of the second optical element at the entrance aperture of the second optical element is identical to the number of segments at the entrance aperture of the collimator or doubled with respect to the number of segments at the entrance aperture of the collimator, and the number of segments of the polygonal cross sectional shape of the second optical element at the exit aperture of the second optical element is either identical to the number of segments at the entrance aperture of the second optical element or doubled with respect to the number of segments at the entrance aperture of the second optical element.

For example, the lighting system may in preferred embodiments be configured such that, in respective planes perpendicular to the optical axis, the number of segments of the polygonal cross sectional shape of the collimator at the entry aperture of the collimator is 8, the number of segments of the polygonal cross sectional shape of the collimator at the exit aperture of the collimator is 8, the number of segments of the polygonal cross sectional shape of the second optical element at the entry aperture of the second optical element is 8, and the number of segments of the polygonal cross sectional shape of the second optical element at the exit aperture of the second optical element is 16.

In another example, the lighting system may be configured such that, in respective planes perpendicular to the optical axis, the number of segments of the polygonal cross sectional shape of the collimator at the entry aperture of the collimator is 6, the number of segments of the polygonal cross sectional shape of the collimator at the exit aperture of the collimator is 6, the number of segments of the polygonal cross sectional shape of the second optical element at the entry aperture of the second optical element is 6, and the number of segments of the polygonal cross sectional shape of the second optical element at the exit aperture of the second optical element is 12.

By the use of polygonal cross sectional shapes of the collimator and/or the second optical element, a further advantage is gained in that the color homogeneity of the output light is enhanced. In fact, the optimal-color homogeneity is obtained when the polygonal cross section has between 5 and 9 segments. Although some degradation of the illumination pattern can be noticed in the form of e.g. an octagonal shape of the light beam when using such a low number of segments, i.e. 8 segments, this can be minimized by changing the number of segments from the entrance aperture towards the exit aperture at the expense of little loss in color homogeneity.

To advantageously increase the efficiency even more, not only the collimator but also the second optical component can be made of a transparent dielectric employing total internal reflection. In the latter case this is realized by means of a prism structure located on the outside surface of the second optical component. Although the collimator can be configured with flat facets that employ total internal reflection, also the outside surface of the collimator can be provided with prism structures that employ total internal reflection and enable alternative shapes of the collimator.

Another advantage is that, by utilizing total internal reflection no reflective layer is needed on the collimator and second optical component, it is possible to manufacture the collimator and the second optical component in one piece by way of, e.g., injection molding.

BRIEF DESCRIPTION OF THE DRAWINGS

FIG. 2a is a schematically drawn cross-section view of a lighting system according to a preferred embodiment of the present invention.

FIG. 2b is a schematically drawn top view of the lighting system according to a preferred embodiment of the present invention illustrated in FIG. 2a.

FIG. 3 is a schematically drawn cross-section of a lighting system according to preferred embodiment of the present invention.

FIG. 4a is a schematically drawn side view of a reflector in a lighting system according to a preferred embodiment of the present invention.

FIG. 4b is a schematically drawn top view of the reflector in a lighting system according to a preferred embodiment of the present invention illustrated in FIG. 4a.

FIG. 5a is a schematically drawn top view of a reflector in a lighting system according to a preferred embodiment of the present invention.

FIG. 5b is a schematically drawn perspective view of the reflector in a lighting system according to a preferred embodiment of the present invention illustrated in FIG. 5a.

PREFERRED EMBODIMENTS

Figure 1A:
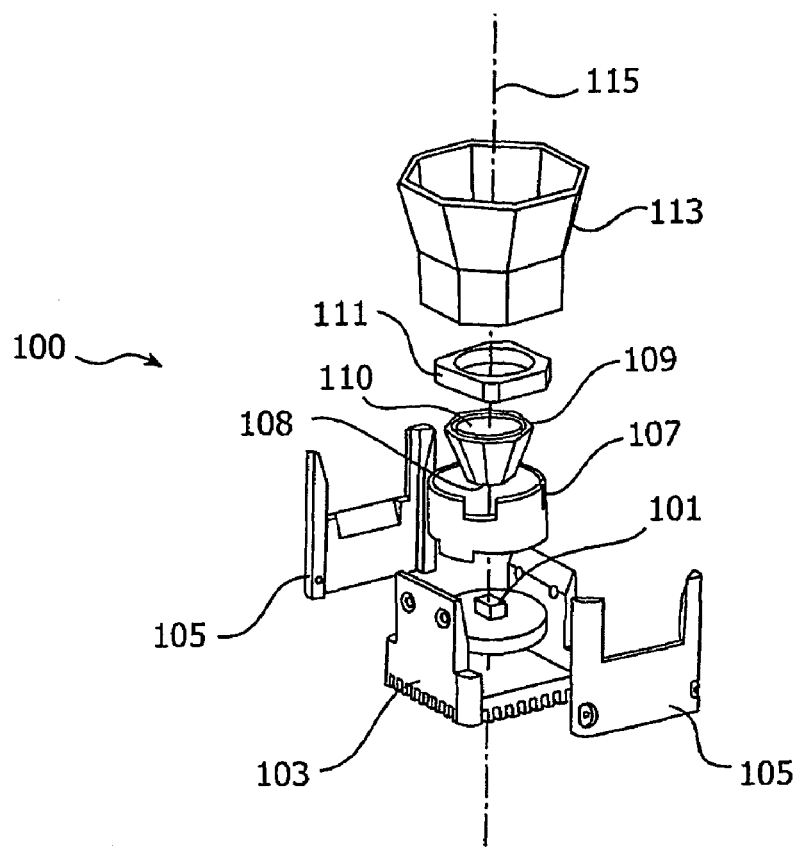
FIG. 1a is an exploded view of individual parts comprised in a light source according to a preferred embodiment of the present invention.

With reference to FIG. 1a, a lighting system 100 according to a preferred embodiment of the present invention comprises light sources in the form of an array of light emitting diodes (LED) 101 arranged on a base 103 and concentrically arranged around an optical axis 115. Means for providing electric power as well as control signals to the LED's are needed. Additionally, optical and/or thermal sensors can be applied to provide feed back signals to the driver and/or control electronics. However, as the skilled person will realize, these are not shown in FIG. 1a for the sake of simplicity. Protecting side walls 105 are configured to be attached to the base 103 that also contribute to the heat transfer.

Concentric with the optical axis 115 are a number of optical components arranged as follows. A cylindrical tube 107 is configured to enclose a dielectric collimator 109 having surfaces that achieve total internal reflection (TIR) of the light emitted from the LED array. The collimator is made of a transparent dielectric preferably made of Polymethyl Methacrylate (PMMA) and shaped such that it defines an entry aperture 108 for the light emitted from the LED's 101 and an exit aperture 110 for the collimated light. The entry aperture 108 is smaller than the exit aperture 110

An intermediate unit 111 is located between the collimator 109 and a second optical element in the form of a reflector 113. The intermediate unit 111 performs the function of holding the collimator 109 in place and to provide an interface to the reflector 113. The reflector 113 has a polygonal cross sectional shape perpendicular to the optical axis 115. Preferably, the reflector 113 provides reflection of light exiting from the collimator 109 by way of TIR in its outer surface, although it is possible, in other embodiments, that the inside surface of the reflector 113 instead is coated with a reflective material such as aluminum. Here the cross section of the reflector 113 is octagonal, but other shapes are also feasible, as will be illustrated in more detail below.

Figure 1B:
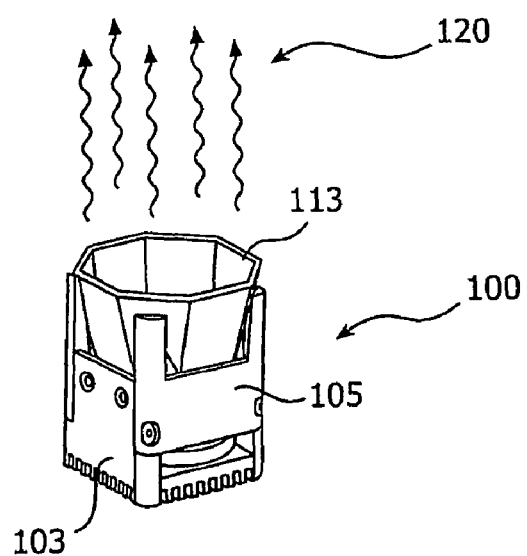
FIG. 1b shows an assembled light source according to a preferred embodiment of the present invention.

In FIG. 1b, the lighting system 100 is shown when assembled and emitting light 120 having any desired color mix that depends, e.g., on the choice of LED's 101 and/or on the LED drive currents that can be adjusted independently for different colors of light emitted by the LED's.

Efficiency calculations, based on ray trace simulations, show that an increase in efficiency by about 10% can be obtained when the collimator 109 provides TIR, as compared to a reference device having an aluminum coated reflector (reflection coefficient of 85%) that is filled with a dielectric. Simulations have also shown that an additional efficiency enhancement of about 10% can be obtained by using a reflector 113 based on TIR when compared to an aluminum or aluminum coated reflector with a typical reflection coefficient of 85%.

In FIGS. 2a and 2b, a preferred embodiment of a lighting system 200 comprising a collimator 209 and a reflector 213 is illustrated in the form of a cross-section view in FIG. 2a and a top view in FIG. 2b. Similar to the embodiment of the system 100 illustrated in FIGS. 1a and 1b, both the collimator 209 and the reflector 213 are arranged concentric with respect to an optical axis 215.

The collimator 209, which preferably is formed by a solid block of Polymethyl Methacrylate (PMMA) having facetted surfaces 222, has a an entry aperture 208, at which a light source 201 comprising a plurality of light emitters, e.g. light emitting diodes, is located, and a planar exit aperture 210. The reflector 213 is in the shape of a hollow tapered cylinder having a cylinder wall 214 with an outside surface 215 and an inner surface 216. The reflector 213 is also preferably formed by Polymethyl Methacrylate (PMMA) in case prism structures are employed at the outside surface of the reflector to provide TIR. In those cases where no TIR is employed in the reflector 213, a reflective inner surface 216 is required, which can be realized by e.g. applying a reflective coating. The exit aperture 210 of the collimator 209 also defines an entry aperture of the reflector 213 and the reflector 213 has an exit aperture indicated by reference numeral 240.

Light emanates from the light source 201 and enters the collimator 209 via the entry aperture 208. The light is then subject to total internal reflection (TIR) within the collimator 209 and exits via the exit aperture 210 of the collimator into the reflector 213. In the reflector 213 the light is again subject to TIR at the outside surface 215 of the reflector 213 and finally exits via the exit aperture 240 of the reflector 213. An increase of about 20% in efficiency in terms of the ratio of the light power exiting from the reflector 213 to the light power entering the collimator 209, has been simulated when using a reference system having aluminum covered reflective surfaces.

Both the collimator 209 and the reflector 213 are faceted in five facet levels, as exemplified by facet 230 located at a fifth facet level, as counted from a first facet level being located at the entry aperture 208 of the collimator 209. In a favorable embodiment, each facet level has an octagonal cross-sectional shape perpendicular to the optical axis 215, as can be seen in FIG. 2b. The geometry of the facet levels of both the collimator and the reflector is further defined by the radii R0, R1, R2, R3, R4, R5, which is the distance from the optical axis 215 to the middle of the bottom-side of the corresponding facet level, and the angles A1, A2, A3, A4 and A5, where R0 should be larger than the radius of the light source. Numerical values for the radii and the angles are given in the following table:

| Radius R | Angle A (degrees) |
|---|---|
| R0 | — |
| R1 = R0 + 2.054*R0*tan(A1) | A1 = 38.0 |
| R2 = R1 + 2.980*R0*tan(A2) | A2 = 20.5 |
| R3 = R2 + 2.750*R0*tan(A3) | A3 = 27.0 |
| R4 = R3 + 3.000*R0*tan(A4) | A4 = 17.5 |
| R5 = R4 + 3.750*R0*tan(A5) | A5 = 12.5 |

Although not shown in FIGS. 2a and 2b, the facetted surface 222 of the collimator 209 and the facetted surfaces of the reflector 213 may in alternative embodiments be provided with a plurality of prism structures extending from the entry aperture 208 to the exit aperture 210. That is, prism structures corresponding to those prism structures 470 of a reflector 413 described below in connection with FIGS. 4a and 4b.

In FIG. 3, another embodiment of a collimator 309 having facetted surfaces 322 and a reflector 313 is shown. As in the embodiment illustrated in FIGS. 2a and 2b, the collimator 309 has a light source 301 located at an entry aperture 308. In contrast to the embodiment in FIG. 2a, the collimator 309 has a convex shaped exit aperture 310, which also defines an entry aperture of the reflector 313. An exit aperture of the reflector is denoted by reference numeral 340.

By having a convex shape, the exit aperture 310 can be smaller in diameter than in the case of a flat exit aperture and can be located closer to the light emitters 308, thereby reducing the volume of the collimator and the overall dimensions of the lighting system.

Turning now to FIGS. 4a and 4b, another preferred embodiment of a reflector 413 will be discussed. FIG. 4a is a side view of the reflector 413 and FIG. 4b is a top view of the reflector 413. As in the previous embodiments, the reflector 413 has an entry aperture 410 and an exit aperture 440. The reflector 413 is facetted, as illustrated by facet 430 and, as in the previous embodiment, the shape of a cross section perpendicular to an optical axis 415 is octagonal as is clearly visible in FIG. 4b.

In contrast to the previous embodiments however, the reflector 413 in this embodiment comprises, on its outside surface, elongated prism structures 470 that are oriented parallel to each other. These prism structures 470 provide TIR of light entering into the reflector 413 and it has been calculated that an additional gain of about 10% in efficiency of the light throughput can be obtained by the use of a reflector having such prism structures 470.

In other preferred embodiments, facets of a collimator may also comprise elongated prism structures that provide TIR. Moreover, the prism structures may be oriented such that a distance between any two structures at the exit aperture is larger than the distance between said any two structures at the entry aperture.

Yet another embodiment of a reflector 513 according to the invention is illustrated in FIGS. 5a and 5b. As in the previous embodiments, the reflector 513 is facetted, as exemplified by a facet 530, and has an entry aperture 550 and an exit aperture 560. In contrast to the previous embodiments, however, the reflector 513 is configured with a slightly different facet structure. That is, at the entry aperture 550 the number of facets is 8 and at the exit aperture 560 the number of facets is 16. Moreover, the reflector 513 is in this embodiment provided with a reflective layer on its inside that reflects the light entering the entry aperture 550 out of the exit aperture 560.

Other embodiments of a system according to the invention may also include a collimator having a facet structure similar to that of the reflector 513 of FIG. 5a and 5b.

Figure 6:
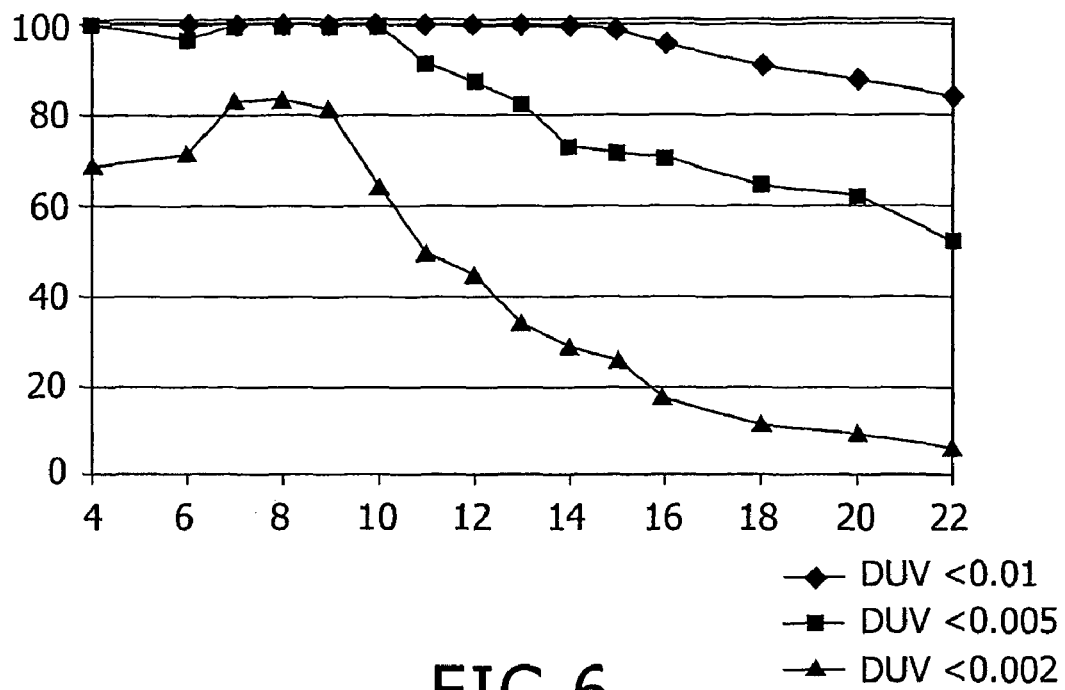
FIG. 6 is a diagram showing simulation results for color homogeneity for different embodiments of the present invention.
Figure 7:
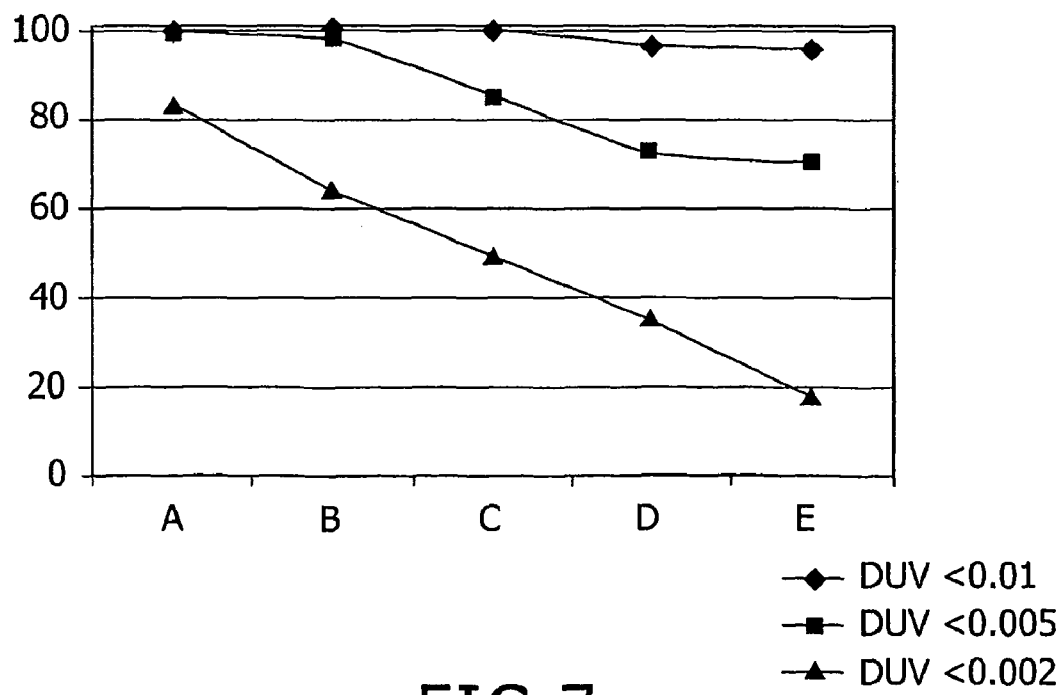
FIG. 7 is a diagram showing further simulation results for color homogeneity for different embodiments of the present invention.

Turning now to FIGS. 6 and 7, results from a number of simulations using ray tracing methods will be presented. The results presented in FIGS. 6 and 7 have been obtained using a system with a collimator that has two segment levels and a reflector that has three facet levels and for which the number and/or configurations of the facets is varied.

FIG. 6 is a diagram showing relative color homogeneity as a function of number of facet segments used in the construction of a collimator and a reflector, e.g. as in the embodiments described with reference to FIGS. 1a, 1b, 2a, 2b and FIG. 3. In this figure the color uniformity is expressed in terms of the uv color coordinates of the Uniform Chromaticity Scale (UCS) as defined by the Commission Internationale de l'Eclairage (CIE) in 1960. The deviations of the color point of the angular light distribution of the emitted light beam, i.e., the color point deviations as a function of the direction of the emitted light, can be presented as $\Delta uv$ defined as $\Delta uv = \sqrt{((\Delta u)^2 + (\Delta v)^2)}$ where $\Delta u = u - u_{ref}$ and $\Delta v = v - v_{ref}$, u and v being the angle-dependent color coordinates of the light beam and $u_{ref}$ and $v_{ref}$ being the color coordinates of a reference, the reference in this case being the average color point of the light beam. In the FIGS. 6 and 7 the percentage of the light beam showing a color deviation, with reference to the reference color point, less than a certain deviation level is presented as a function of the segmentation of the reflector, where the deviation level is a parameter and several deviation levels are indicated in the legenda of the figures. As can be seen in the diagram in FIG. 6, by having a collimator and a reflector both having an octagonal facet structure, a relative color homogeneity of at least 80% can be obtained. For selecting the beam shaper type with best color mixing properties, calculations with various color maximum deviations are used. Color deviations smaller then $\Delta UV=0.002$ are in general not visible. Small deviations with $\Delta UV$ smaller then 0.005 may be acceptable depending on application.

In FIG. 6 can be seen that the highest percentage of the solid angle of the light beam where the color deviation $\Delta UV<0.002$ is obtained with a number of segments is between 7 and 9. This may vary somewhat with the light emitter configuration. If larger deviations are allowed then a wider range of a number of segments can be applied as deduced from the figure.

FIG. 7 is a diagram showing relative color homogeneity as a function of number of facet segments used in the construction of a collimator and a reflector, e.g. as in the embodiment described with reference to FIGS. 5a and 5b.

The first plotted result denoted as beamshaper type A corresponds to a collimator and a reflector both having an octagonal facet structure with a total of five facet levels, i.e. similar to the system for which results were presented in FIG. 6. The second plotted point, denoted by beamshaper type B shows the results for a system where the first and second levels of facets i.e. the two facets levels of the collimator have an octagonal cross-sectional shape and for the remaining three levels the number of facets is 16. Beamshaper type B is also shown in FIG. 5a. Here can be seen that the third level starts with 8 segments of the polygonal cross-sectional shape at the entry aperture 550 and ending with 16 segments at the entry aperture of the fourth level. The lengths of the segments of the hexadecagonal cross-sectional shape increasingly approach each other with increasing distance from the entry aperture of the reflector and at the exit aperture 560 of the reflector 513 the cross-sectional shape is hexadecagonal with equally long segments as is shown in FIG. 5a. Similarly, the third plotted point, denoted by beamshaper type C shows the results for a system where the first level of facets have an octagonal cross-sectional shape and for the remaining four levels the number of facets is 16. Similarly, the fourth plotted point, denoted by beamshaper type D shows the results for a system where the entry aperture of the collimator has an octagonal cross-sectional shape while for all facet levels the number of facets is 16. Finally, the plotted point denoted by beamshaper type E shows the results for using a system that comprises a collimator and a reflector that both have a facet structure that has a cross-sectional polygonal shape with 16 equally long segments.

In FIG. 7 it is shown that beamshaper type B gives the best color homogeneity for a system with a hexadecagonal exit aperture of the reflector. Although beamshaper type A results in slightly better color homogeneity then beamshaper type B, beamshaper B is preferable because of the rounder beamshape.

The results presented in the diagrams of FIGS. 6 and 7 illustrate that an octagonal facet structure is the configuration that provides the best color homogeneity. However, due to the octagonal shape of the collimator and reflector the appearance of the beam of light exiting from the system may to a viewer appear octagonal in shape. By increasing the number of segments this appearance will get more 'round', which in many cases is preferred. However, by increasing the number of facets in the system, the color homogeneity will suffer. As FIG. 7 then shows, a compromise between appearance and color homogeneity can be obtained by providing a system in which the number of facets close to the light source is lower than the number of facets close to the exit aperture of the system.

Finally, it should be noted regarding all embodiments described above with reference to FIGS. 1 to 5, that an additional reflector may be mounted concentrically outside and close to the first collimator to provide collimation and mixing of the light emitted by the light source that is not reflected by the collimator. Moreover, an additional reflector may also be mounted concentrically outside and close to the reflector to provide further collimation and mixing of the light emitted from the collimator that is not reflected by the reflector. One or more light diffusing surfaces may also be arranged within the lighting system, in order to further homogenize the light beam exiting from the system.

Hence, to summarize, a light source comprises a number of optical components aligned concentrically along an optical axis. The optical components include an array of light emitting diodes, a dielectric collimator having surfaces configured to provide total internal reflection of light emitted from the array of diodes, and a second stage reflector to further collimate the beam and which also may be based on total internal reflection by a prism structure on the outside.

The invention claimed is:
1. A lighting system comprising a plurality of optical components aligned concentrically along an optical axis, where the components include:
   a plurality of light sources that emit light of at least a respective first and second color,
   a dielectric collimator having an entry aperture and an exit aperture, said entry aperture being in optical contact with the light sources, said collimator having facetted surfaces configured to provide total internal reflection of light emitted from the light sources and thereby providing color-homogenized and collimated light exiting from the exit aperture, and an optical element having an entry aperture and an exit aperture and configured to further color homogenize and collimate the light exiting from the collimator, wherein the collimator and/or the optical element comprise a transparent dielectric having an outside surface comprising a plurality of elongated prism structures.

2. The lighting system according to claim 1, wherein the exit aperture of the collimator comprises a flat surface oriented perpendicular to the optical axis.

3. The lighting system according to claim 1, wherein the exit aperture of the collimator comprises a convex surface.

4. The lighting system according to claim 1, wherein a first cross-sectional area, perpendicular to the optical axis, at the exit aperture of the collimator is larger than a second cross-sectional area, perpendicular to the optical axis, at the entry aperture of the collimator.

5. The lighting system according to claim 1, wherein the collimator comprises a polygonal cross sectional shape perpendicular to the optical axis.

6. The lighting system according to claim 5, wherein the number of segments of the polygonal cross sectional shape of the collimator in a plane perpendicular to the optical axis at the exit aperture of the collimator is larger than at the entry aperture of the collimator.

7. The lighting system according to claim 5, wherein the collimator comprises any one shape of a hexagonal, heptagonal, octagonal and enneagonal cross sectional shape perpendicular to the optical axis at the exit aperture of the collimator.

8. The lighting system according to claim 1, wherein the optical element is a reflector having facetted surfaces.

9. The lighting system according to claim 1, wherein a first cross-sectional area, perpendicular to the optical axis, at the exit aperture of the optical element is larger than a second cross-sectional area, perpendicular to the optical axis, at the entry aperture of the optical element.

10. The lighting system according to claim 1, wherein the optical element comprises a polygonal cross-sectional shape perpendicular to the optical axis.

11. The lighting system according to claim 10, wherein the number of segments of the polygonal cross sectional shape of the optical element in a plane perpendicular to the optical axis at the exit aperture of the optical element is larger than at the entry aperture of the optical element.

12. The lighting system according to claim 10, wherein the number of segments of the polygonal cross sectional shape of the optical element in a plane perpendicular to the optical axis at the entry aperture of the optical element corresponds to any one shape of a hexagonal, heptagonal, octagonal and enneagonal shape and at the exit aperture of the optical element the number of segments of the polygonal cross sectional shape is 12, 14, 16 or 18 respectively.

13. The lighting system according to claim 1, wherein the collimator is made of a transparent dielectric having an outside surface that comprises a plurality of elongated prism structures to provide the total internal reflection of the light emitted from the light sources.

14. The lighting system according to claim 13, wherein the elongated prism structures extend in a direction from the entry aperture of the collimator to the exit aperture of the collimator.

15. The lighting system according to claim 14, wherein at least one facet of the collimator comprises elongated prism structures that are oriented parallel to each other.

16. The lighting system according to claim 14, wherein at least one facet of the collimator comprises elongated prism structures that are oriented such that a distance between any two structures at the exit aperture of the collimator is larger than the distance between said any two structures at the entry aperture of the collimator.

17. The lighting system according to claim 1, wherein the index of refraction of the dielectric collimator is larger than 1.3.

18. The lighting system according to claim 1, wherein the collimator is made of a dielectric material provided with a cavity to accommodate the light sources and filled with an transparent or translucent medium between the dielectric material and the light sources.

19. The lighting system according to claim 18, wherein the dielectric material is selected from a group consisting of: glass, sol-gel, ceramic, polymer and silicon resin.

20. The lighting system according to claim 1, wherein the optical element is made of a transparent dielectric having an outside surface that comprises a plurality of elongated prism structures to provide the total internal reflection of the light emitted from the light sources.

21. The lighting system according to claim 20, wherein the elongated prism structures extend in a direction from the entry aperture of the optical element to the exit aperture of the optical element.

22. The lighting system according to claim 21, wherein at least one facet of the optical element comprises elongated prism structures that are oriented parallel to each other.

23. The lighting system according to claim 21, wherein at least one facet of the optical element comprises elongated prism structures that are oriented such that a distance between any two structures at the exit aperture of the optical element is larger than the distance between said any two structures at the entry aperture of the optical element.

24. The lighting system according to claim 1, wherein the index of refraction of the optical element is larger than 1.3.

25. The lighting system according to claim 1, wherein the optical element is made of a material selected from a group consisting of: glass, sol-gel, ceramic, polymer and silicon resin.

26. The lighting system according to claim 5, wherein in respective planes perpendicular to the optical axis:
the number of segments of the polygonal cross sectional shape of the collimator at the entry aperture of the collimator is a first integer number in the interval 4 to 9,
the number of segments of the polygonal cross sectional shape of the collimator at the exit aperture of the collimator, and the number of segments of the polygonal cross sectional shape of the optical element at the entry aperture of the optical element are any one of said first integer number and a second integer number, said second integer number being two times the first integer number, and
the number of segments of the polygonal cross sectional shape of the optical element at the exit aperture of the optical element is any one of said second integer number and a third integer number, said third integer number being two times the second integer number.

27. The lighting system according to claim 26, wherein in respective planes perpendicular to the optical axis:
the number of segments of the polygonal cross sectional shape of the collimator at the entry aperture of the collimator is 6,
the number of segments of the polygonal cross sectional shape of the collimator at the exit aperture of the collimator is 6, the number of segments of the polygonal cross sectional shape of the optical element at the entry aperture of the optical element is 6, and the number of segments of the polygonal cross sectional shape of the optical element at the exit aperture of the optical element is 12.

28. The lighting system according to claim 26, wherein in respective planes perpendicular to the optical axis:

the number of segments of the polygonal cross sectional shape of the collimator at the entry aperture of the collimator is 8, the number of segments of the polygonal cross sectional shape of the collimator at the exit aperture of the collimator is 8, the number of segments of the polygonal cross sectional shape of the optical element at the entry aperture of the optical element is 8, and the number of segments of the polygonal cross sectional shape of the optical element at the exit aperture of the optical element is 16.

29. The lighting system according to claim 1, further comprising one or more light diffusing surfaces.

* * * * *